United States Patent
Chen (10) Patent No.: US 10,468,458 B2
(45) Date of Patent: Nov. 5, 2019

(54) RESISTIVE RANDOM ACCESS MEMORY HAVING SELECTOR AND CURRENT LIMITER STRUCTURES

(71) Applicant: Winbond Electronics Corp., Taichung (TW)

(72) Inventor: Frederick Chen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/151,452

(22) Filed: May 10, 2016

(65) Prior Publication Data

US 2017/0330915 A1   Nov. 16, 2017

(51) Int. Cl.
*H01L 45/00* (2006.01)
*H01L 27/24* (2006.01)
*H01L 23/528* (2006.01)

(52) U.S. Cl.
CPC ........ *H01L 27/2481* (2013.01); *H01L 23/528* (2013.01); *H01L 27/2409* (2013.01); *H01L 45/1233* (2013.01); *H01L 45/1246* (2013.01); *H01L 45/146* (2013.01)

(58) Field of Classification Search
CPC ..... H01L 45/04; H01L 45/08; H01L 45/1233; H01L 29/66143; H01L 27/2418; H01L 27/2481; H01L 27/2409; H01L 45/1246; H01L 45/146
See application file for complete search history.

(56) References Cited

U.S. PATENT DOCUMENTS

| | | | |
|---|---|---|---|
| 6,753,561 B1 * | 6/2004 | Rinerson | G11C 11/5685 257/295 |
| 7,446,010 B2 * | 11/2008 | Li | G11C 13/0007 257/E21.304 |
| 8,072,795 B1 | 12/2011 | Wang et al. | |
| 8,227,788 B2 * | 7/2012 | Mikawa | G11C 13/0007 257/2 |
| 8,642,985 B2 | 2/2014 | Chen et al. | |
| 8,642,989 B2 | 2/2014 | Liu et al. | |
| 9,178,143 B2 | 11/2015 | Chen et al. | |
| 9,246,092 B1 * | 1/2016 | Bodke | H01L 45/00 |
| 9,251,898 B2 * | 2/2016 | Katayama | H01L 27/101 |
| 9,318,531 B1 * | 4/2016 | Mathur | H01L 45/16 |
| 2007/0015348 A1 * | 1/2007 | Hsu | H01L 27/101 438/570 |

(Continued)

OTHER PUBLICATIONS

"Office Action of Taiwan Counterpart Application", dated Mar. 27, 2018, p. 1-p. 4.

(Continued)

*Primary Examiner* — Cuong Q Nguyen
*Assistant Examiner* — Shih Tsun A Chou
(74) *Attorney, Agent, or Firm* — JCIPRNET (57) ABSTRACT

A resistive random access memory includes a memory cell disposed at an intersection point between a first conductive line and a second conductive line. The memory cell includes a selector structure, a first current limiter structure and a resistor structure. The first current limiter structure is disposed between the selector structure and the first conductive line. The resistor structure is disposed between the selector structure and the second conductive line or between the first current limiter structure and the first conductive line.

13 Claims, 5 Drawing Sheets

(56) References Cited

U.S. PATENT DOCUMENTS

| | | | | |
|---|---|---|---|---|
| 2010/0008123 | A1* | 1/2010 | Scheuerlein | B82Y 10/00 365/148 |
| 2010/0314602 | A1* | 12/2010 | Takano | G11C 11/5685 257/4 |
| 2012/0170353 | A1* | 7/2012 | Iijima | G11C 11/5685 365/148 |
| 2012/0295413 | A1* | 11/2012 | Fujii | H01L 45/08 438/382 |
| 2013/0026438 | A1 | 1/2013 | Wang et al. | |
| 2013/0119341 | A1 | 5/2013 | Liu et al. | |
| 2013/0128654 | A1* | 5/2013 | Yoneda | H01L 45/00 365/148 |
| 2013/0200324 | A1* | 8/2013 | Pham | H01L 45/1253 257/4 |
| 2013/0270510 | A1* | 10/2013 | Fujii | H01L 45/04 257/5 |
| 2013/0314975 | A1* | 11/2013 | Katayama | H01L 27/101 365/148 |
| 2014/0126267 | A1* | 5/2014 | Ikeda | G11C 13/0069 365/148 |
| 2014/0306173 | A1 | 10/2014 | Huang et al. | |
| 2015/0129824 | A1* | 5/2015 | Lee | H01L 45/04 257/2 |
| 2015/0137178 | A1* | 5/2015 | Hussin | H01L 29/872 257/183 |
| 2015/0179930 | A1* | 6/2015 | Nardi | H01L 45/1253 257/4 |
| 2016/0013406 | A1* | 1/2016 | Lee | H01L 45/146 257/4 |
| 2016/0049447 | A1* | 2/2016 | Jung | H01L 27/2463 257/4 |
| 2016/0118440 | A1* | 4/2016 | Kashefi | H01L 27/2409 257/98 |
| 2016/0149128 | A1* | 5/2016 | Bodke | H01L 45/1286 257/4 |
| 2016/0149129 | A1* | 5/2016 | Bodke | H01L 45/145 257/4 |
| 2017/0322749 | A1* | 11/2017 | Qawami | G06F 3/061 |

OTHER PUBLICATIONS

"Office Action of China Counterpart Application", dated Jun. 25, 2019, pp. 1-7.

* cited by examiner

RESISTIVE RANDOM ACCESS MEMORY HAVING SELECTOR AND CURRENT LIMITER STRUCTURES

BACKGROUND OF THE INVENTION

Field of the Invention

The invention relates to a non-volatile memory, and particularly relates to a resistive random access memory.

Description of Related Art

A resistive random access memory (RRAM) belongs to a non-volatile memory. Since the resistive random access memory has advantages such as simple structure, low operating voltage, fast operating time, multi-bit memorization, low cost, good durability, and the like, it is widely studied now. A common basic structure of the resistive random access memory is composed of a transistor and a resistor (1T1R). A resistance value of the resistor is changed by a method of changing the plus bias voltage, so that the device is in a high resistance state or low resistance state, thereby interpreting the digital signals, such as 0 or 1.

However, as integrated circuits are aiming toward a higher degree of integration through miniaturization, the dimension of the resistive random access memory device need to be reduced in order to increase the degree of integration thereof Therefore, how to reduce the dimension of the resistive random access memory device becomes an important issue of the technological development of the resistive random access memory nowadays.

SUMMARY OF THE INVENTION

The invention provides a resistive random access memory which can reduce the dimension of the resistive random access memory device and increase the degree of integration of the device.

A resistive random access memory of the invention includes a memory cell disposed at an intersection point between a first conductive line and a second conductive line. The memory cell includes a selector structure, a first current limiter structure, and a resistor structure in series, in any order.

The resistive random access memory according to an embodiment of the invention, the selector structure includes a first conductive layer, a selected material layer, and a second conductive layer sequentially.

The resistive random access memory according to an embodiment of the invention, the first current limiter structure includes a third conductive layer, a first metal layer, a first current limiting material layer, and a fourth conductive layer sequentially.

The resistive random access memory according to an embodiment of the invention, the resistor structure includes a fifth conductive layer, a variable resistor layer, and a sixth conductive layer sequentially.

The resistive random access memory according to an embodiment of the invention, one of the fifth or sixth conductive layers has a higher oxygen affinity than the other.

The resistive random access memory according to an embodiment of the invention, the memory cell further includes a second current limiter structure disposed in series with the three elements.

The resistive random access memory according to an embodiment of the invention, the second current limiter structure includes a seventh conductive layer, a second current limiting material layer, and an eighth conductive layer.

The resistive random access memory according to an embodiment of the invention, materials of the first conductive layer and the second conductive layer include titanium nitride, tantalum nitride, titanium, tantalum, or indium tin oxide.

The resistive random access memory according to an embodiment of the invention, a material of the selected material layer includes silicon or titanium dioxide, or amorphous chalcogenide.

The resistive random access memory according to an embodiment of the invention, materials of the third conductive layer and the fourth conductive layer include titanium nitride, tantalum nitride, titanium, tantalum, or indium tin oxide.

The resistive random access memory according to an embodiment of the invention, a material of the first current limiting material layer includes silicon or titanium dioxide.

The resistive random access memory according to an embodiment of the invention, materials of the fifth conductive layer and the sixth conductive layer include titanium nitride, tantalum nitride, titanium, tantalum, or indium tin oxide. One of the fifth or sixth conductive layers has a higher oxygen affinity than the other.

The resistive random access memory according to an embodiment of the invention, a material of the variable resistor layer includes transition metal oxide.

The resistive random access memory according to an embodiment of the invention, the material of the variable resistor layer comprises aluminum, titanium, tellurium, copper, silver, or nickel.

The resistive random access memory according to an embodiment of the invention, materials of the seventh conductive layer and the eighth conductive layer include titanium, titanium nitride, tantalum nitride, titanium, tantalum, or indium tin oxide.

The resistive random access memory according to an embodiment of the invention, a material of the second current limiting material layer includes silicon or titanium dioxide.

Based on the above description, the resistive random access memory structure of the invention can reduce the dimension of the resistive random access memory device by connecting the selector structure and the first current limiter structure onto the resistor structure (i.e. 1R1D1S or 1D1S1R structure) to replace with the traditional resistive random access memory structure (one transistor connected to one resistor structure, i.e. 1T1R structure), and the degree of integration of the device can be increased.

The resistive random access memory of the invention includes the selector structure. In one embodiment, a Schottky barrier is formed between the conductive layer and the selected material layer thereof, which can be used as a switch for controlling the memory cell circuit. A key desired trait for this Schottky barrier to maintain sufficient nonlinearity is that it can be narrowed by high electric field. In another embodiment, the selected material is a chalcogenide that is operated below its crystallization temperature, but undergoes snapback above a threshold voltage.

The resistive random access memory of the invention includes the first current limiter structure. The Schottky barrier that is not narrowed by electric field is formed between the conductive layer or the metal layer, and the current limiting material layer thereof, which can be used as a current limiter for controlling the current volume of the memory cell circuit. That is, the current flowing through the resistor structure can be controlled to less than a saturation current value, so that the irreversible damage resulting from the resistance changed during the SET operating process by the resistor structure can be avoided.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1A:
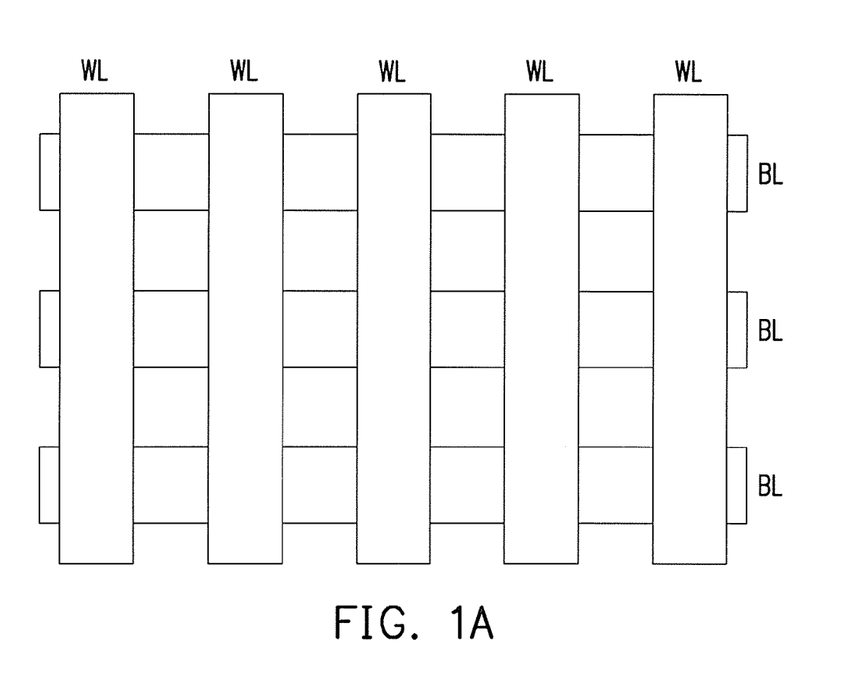
FIG. 1A is a schematic top view of a resistive random access memory of the invention.
Figure 1B:
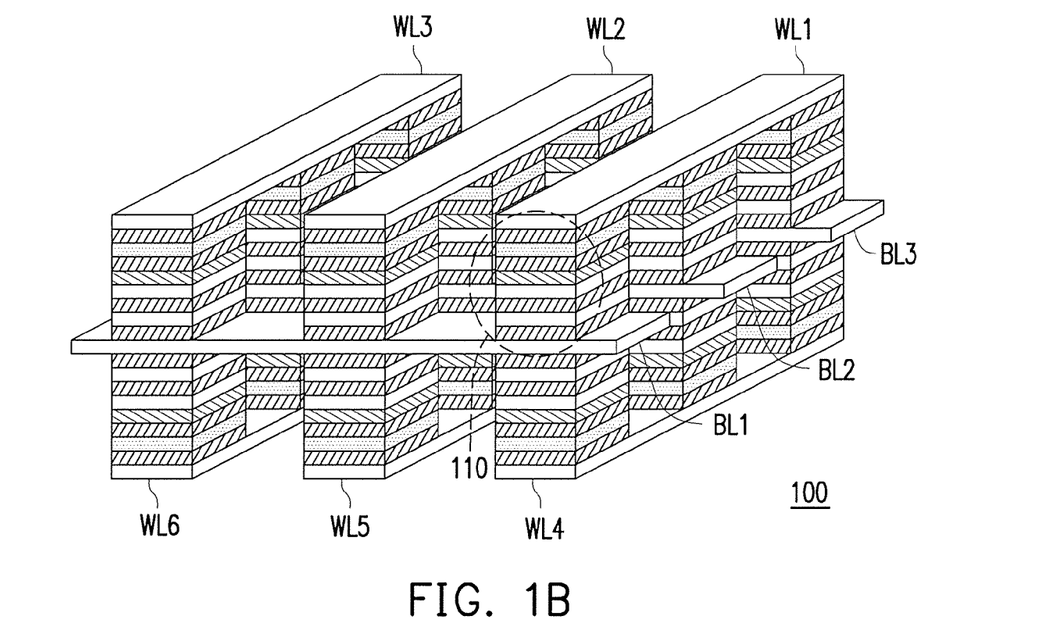
FIG. 1B is a schematic side view of a resistive random access memory of the invention.

FIG. 1A is a schematic top view of a resistive random access memory of the invention. FIG. 1B is a schematic side view of a resistive random access memory of the invention.

Referring to FIG. 1A and FIG. 1B, a resistive random access memory 100 includes a plurality of bit lines BL and a plurality of word lines WL. The plurality of bit lines BL are disposed in parallel with each other. The plurality of word lines WL are disposed in parallel with each other and perpendicularly to the bit lines BL. A memory cell 110 is disposed at an intersection point between each bit line BL and each word line WL. In other words, the memory cell 100 is disposed at an intersection point between two conductive lines WL/BL crossing with each other, for example, wherein one conductive line is used as a word line, and another one conductive line is used as a bit line.

Figure 2A:
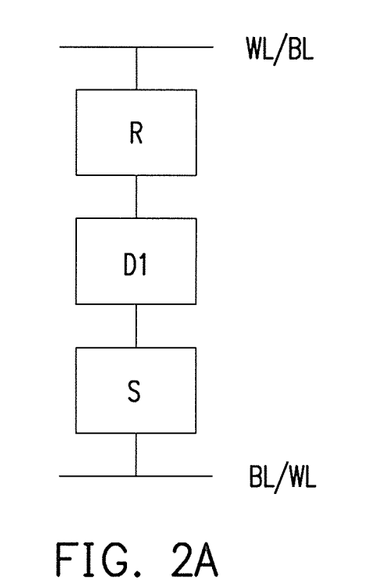
FIG. 2A is a schematic connection view of each structure of a memory cell of a resistive random access memory of a first embodiment of the invention.
Figure 2B:
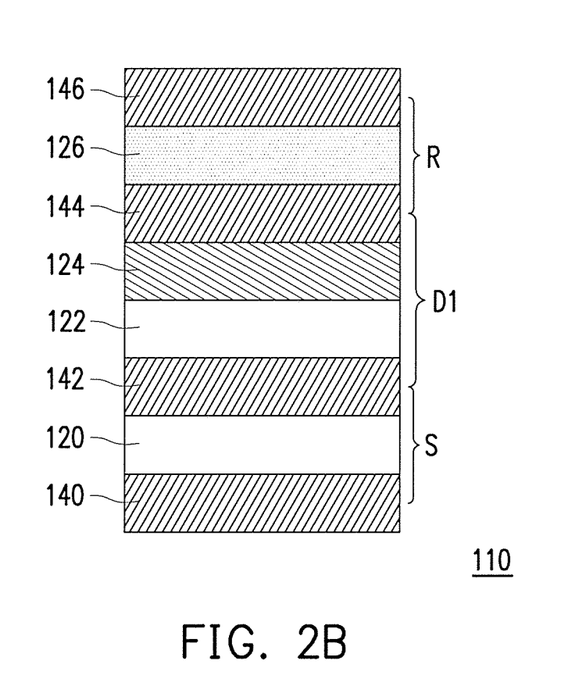
FIG. 2B is a schematic cross-sectional view of each structure of the memory cell of the resistive random access memory of the first embodiment of the invention.

FIG. 2A is a schematic connection view of each structure of a memory cell of a resistive random access memory of a first embodiment of the invention. FIG. 2B is a schematic cross-sectional view of each structure of the memory cell of the resistive random access memory of the first embodiment of the invention.

Referring to FIG. 2A and FIG. 2B, the memory cell 110 includes a selector structure S, a current limiter structure D1, and a resistor structure R, wherein the current limiter structure D1 is disposed between the selector structure S and the conductive lines WL/BL, and the resistor structure R is disposed between the current limiter structure D1 and the conductive lines WL/BL.

The selector structure S includes a conductive layer 142, a selected material layer 120, and a conductive layer 140 sequentially. The selector structure S is a bipolar selector, for example. A Schottky barrier may be fondled between the conductive layer 142, the conductive layer 140, and the selected material layer 120 of the selector structure S, which can be used as a switch for controlling the memory cell circuit. A key desired trait for this Schottky barrier to maintain sufficient nonlinearity is that it can be narrowed by high electric field. This entails that the layer 120 should be sufficiently thin for this to occur. Alternatively, an amorphous chalcogenide is highly insulating below a threshold voltage Vth, but becomes highly conducting above Vth. Materials of the conductive layer 142 and the conductive layer 140 are conductive materials, for example, such as titanium nitride (TiN), tantalum nitride (TaN), titanium (Ti), tantalum (Ta), or indium tin oxide (ITO). A material of the selected material layer 120 is a semiconductor material, for example, such as silicon (Si), or titanium dioxide ($TiO_2$), or an amorphous chalcogenide, e.g., carbon-doped GeTe.

The current limiter structure D1 includes a conductive layer 144, a metal layer 124, a current limiting material layer 122, and the conductive layer 142 sequentially. A thick enough Schottky barrier, that is not narrowed by the electric field, is formed between the conductive layer 144 or the metal layer 124, the current limiting material layer 122, and the conductive layer 142 of the current limiter structure D1, which can be used as a current limiter for controlling the current volume of the memory cell circuit. That is, the current flowing through the resistor structure can be controlled to less than a saturation current value, so that the irreversible damage resulting from the resistance changed during the SET operating process by the resistor structure can be avoided. Materials of the conductive layer 144 and the conductive layer 142 are conductive materials, for example, such as titanium nitride, tantalum nitride, titanium, tantalum, or indium tin oxide. A material of the metal layer 124 is metal, for example, such as titanium. A material of the current limiting material layer 122 is a semiconductor material, for example, such as silicon, or titanium dioxide.

The resistor structure R includes a conductive layer 146, a variable resistor layer 126, and the conductive layer 144 sequentially. Materials of the conductive layer 144 and the conductive layer 146 are conductive materials, for example, such as titanium nitride, tantalum nitride, titanium, tantalum, or indium tin oxide. The conductive layer 144 may have a stronger oxygen affinity than the conductive layer 146. The variable resistor layer 126 may be a single-layer structure or a multi-layer structure. When the variable resistor layer 126 is a single-layer structure, a material thereof is transition metal oxide, for example, such as nickel oxide (NiO), hafnium oxide (HfO), Hafnium dioxide ($HfO_2$), zirconium oxide (ZrO), zirconium dioxide (ZrO$_2$), tantalum pentoxide (Ta$_2$O$_5$), zinc oxide (ZnO), tungsten trioxide (WO$_3$), cobalt oxide (CoO), or niobium pentoxide (Nb$_2$O$_5$). When the variable resistor layer 126 is a multi-layer structure, it may include a metal layer (not shown) and a variable resistor material layer. The metal layer can be used as an oxygen exchange layer. An oxygen affinity of the metal layer is more than oxygen affinities of the conductive layer 144 and the conductive layer 146. A material of the metal layer is a metal material, for example, such as titanium, tantalum, hafnium, zirconium, platinum, or aluminum. A material of the variable resistor material layer is transition metal oxide, for example, such as nickel oxide (NiO), hafnium oxide (HfO), Hafnium dioxide (HfO$_2$), zirconium oxide (ZrO), zirconium dioxide (ZrO$_2$), tantalum pentoxide (Ta$_2$O$_5$), zinc oxide (ZnO), tungsten trioxide (WO$_3$), cobalt oxide (CoO), or niobium pentoxide (Nb$_2$O$_5$).

In the memory cell 110 of the embodiment, the conductive layer 142 is used as an upper electrode of the selector structure S and a lower electrode of the current limiter structure D1 simultaneously, and the conductive layer 144 is used as an upper electrode of the current limiter structure D1 and a lower electrode of the resistor structure R simultaneously. The conductive layer 142 and the conductive layer 144 may be single-layer materials or multi-layer materials respectively. When they are multi-layer materials, each layer can be used as an upper electrode or a lower electrode of each of the above-mentioned structures respectively, wherein materials of each layer may be the same or different.

In the memory cell 110 of the embodiment, the conductive layer 146 is used as an upper electrode of the memory cell 110, and the conductive layer 140 is used as a lower electrode of the memory cell 110. The conductive layer 146 used as an upper electrode may be in the same layer of the bit lines or the word lines, and the conductive layer 140 used as a lower electrode may be in the same layer of the bit lines or the word lines. For example, when the conductive layer 140 is in the same layer of the bit lines, the conductive layer 146 is in the same layer of the word lines; or when the conductive layer 140 is in the same layer of the word lines, the conductive layer 146 is in the same layer of the bit lines.

Figure 3A:
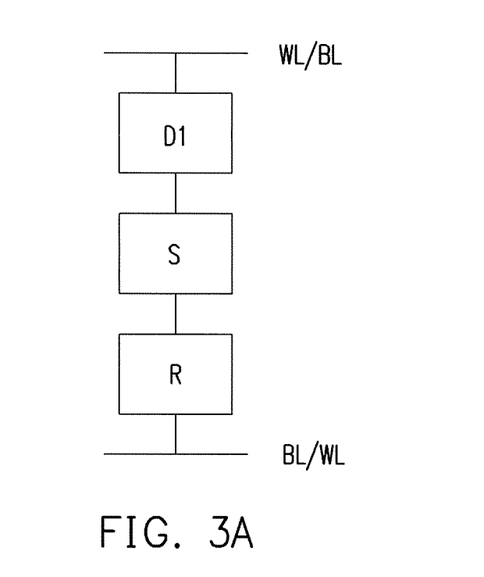
FIG. 3A is a schematic connection view of each structure of a memory cell of a resistive random access memory of a second embodiment of the invention.
Figure 3B:
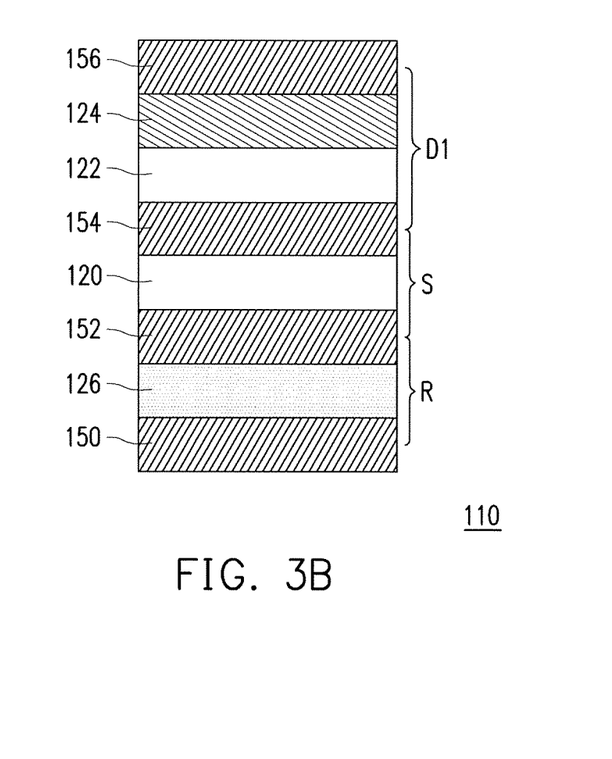
FIG. 3B is a schematic cross-sectional view of each structure of the memory cell of the resistive random access memory of the second embodiment of the invention.

FIG. 3A is a schematic connection view of each structure of a memory cell of a resistive random access memory of a second embodiment of the invention. FIG. 3B is a schematic cross-sectional view of each structure of the memory cell of the resistive random access memory of the second embodiment of the invention.

Referring to FIG. 3A and FIG. 3B, the memory cell 110 includes the selector structure S, the current limiter structure D1, and the resistor structure R, wherein the current limiter structure D1 is disposed between the selector structure S and the conductive lines WL/BL, and the resistor structure R is disposed between the selector structure S and the conductive lines BL/WL.

The selector structure S includes a conductive layer 154, the selected material layer 120, and a conductive layer 152 sequentially. The selector structure S is a bipolar selector, for example. A Schottky barrier may be formed between the conductive layer 154, the conductive layer 152, and the selected material layer 120 of the selector structure S, which can be used as a switch for controlling the memory cell circuit. Or the selected layer is an amorphous chalcogenide with threshold voltage Vth. That is, the circuit is maintained open when the bias voltage V is not reached the Vth (i.e. 0<|V|<|Vth|), and the circuit is closed when the bias voltage V exceeds the Vth (i.e. |V|>|Vth|). Materials of the conductive layer 154 and the conductive layer 152 are conductive materials, for example, such as titanium nitride (TiN), tantalum nitride (TaN), titanium (Ti), tantalum (Ta), or indium tin oxide (ITO). The material of the selected material layer 120 is a semiconductor material, for example, such as silicon (Si), titanium dioxide (TiO$_2$), or amorphous chalcogenide.

The current limiter structure D1 includes a conductive layer 156, the metal layer 124, the current limiting material layer 122, and the conductive layer 154 sequentially. The Schottky barrier is formed between the current limiting material layer 122 and the conductive layer 154 of the current limiter structure D1, which can be used as a current limiter for controlling the current volume of the memory cell circuit. That is, the current flowing through the resistor structure can be controlled to less than a saturation current value, so that the irreversible damage resulting from the resistance changed during the SET operating process by the resistor structure can be avoided. Materials of the conductive layer 156 and the conductive layer 154 are conductive materials, for example, such as titanium nitride, tantalum nitride, titanium, tantalum, or indium tin oxide. The material of the metal layer 124 is metal, for example, such as titanium. The material of the current limiting material layer 122 is a semiconductor material, for example, such as silicon, or titanium dioxide.

The resistor structure R includes the conductive layer 152, the variable resistor layer 126, and a conductive layer 150 sequentially. Materials of the conductive layer 152 and the conductive layer 150 are conductive materials, for example, such as titanium nitride, tantalum nitride, titanium, tantalum, or indium tin oxide. The variable resistor layer 126 may be a single-layer structure or a multi-layer structure. When the variable resistor layer 126 is a single-layer structure, a material thereof is transition metal oxide, for example, such as nickel oxide (NiO), hafnium oxide (HfO), Hafnium dioxide (HfO$_2$), zirconium oxide (ZrO), zirconium dioxide (ZrO$_2$), tantalum pentoxide (Ta$_2$O$_5$), zinc oxide (ZnO), tungsten trioxide (WO$_3$), cobalt oxide (CoO), or niobium pentoxide (Nb$_2$O$_5$). When the variable resistor layer 126 is a multi-layer structure, it may include a metal layer (not shown) and a variable resistor material layer. The metal layer can be used as an oxygen exchange layer. An oxygen affinity of the metal layer is more than oxygen affinities of the conductive layer 152 and the conductive layer 150. A material of the metal layer is a metal material, for example, such as titanium, tantalum, hafnium, zirconium, platinum, or aluminum. A material of the variable resistor material layer is transition metal oxide, for example, such as nickel oxide (NiO), hafnium oxide (HfO), Hafnium dioxide (HfO$_7$), zirconium oxide (ZrO), zirconium dioxide (ZrO$_2$), tantalum pentoxide (Ta$_2$O$_5$), zinc oxide (ZnO), tungsten trioxide (WO$_3$), cobalt oxide (CoO), or niobium pentoxide (Nb$_2$O$_5$).

In the memory cell 110 of the embodiment, the conductive layer 154 is used as an upper electrode of the selector structure S and a lower electrode of the current limiter structure D1 simultaneously, and the conductive layer 152 is used as an upper electrode of the resistor structure R and a lower electrode of the selector structure S simultaneously. The conductive layer 154 and the conductive layer 152 may be single-layer materials or multi-layer materials respectively. When they are multi-layer materials, each layer can be used as an upper electrode or a lower electrode of each of the above-mentioned structures respectively, wherein materials of each layer may be the same or different.

In the memory cell 110 of the embodiment, the conductive layer 156 is used as an upper electrode of the memory cell 110, and the conductive layer 150 is used as a lower electrode of the memory cell 110. The conductive layer 156 used as an upper electrode may be in the same layer of the bit lines or the word lines, and the conductive layer 150 used as a lower electrode may be in the same layer of the bit lines or the word lines. For example, when the conductive layer 156 is in the same layer of the bit lines, the conductive layer 150 is in the same layer of the word lines; or when the conductive layer 156 is in the same layer of the word lines, the conductive layer 150 is in the same layer of the bit lines.

Figure 4A:
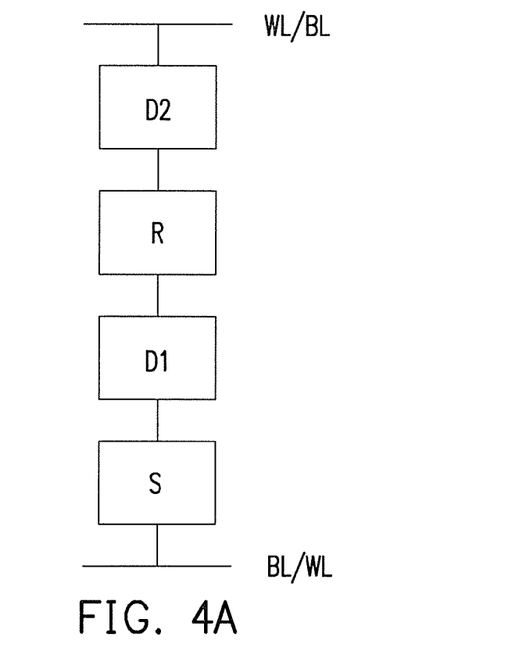
FIG. 4A is a schematic connection view of each structure of a memory cell of a resistive random access memory of a third embodiment of the invention.
Figure 4B:
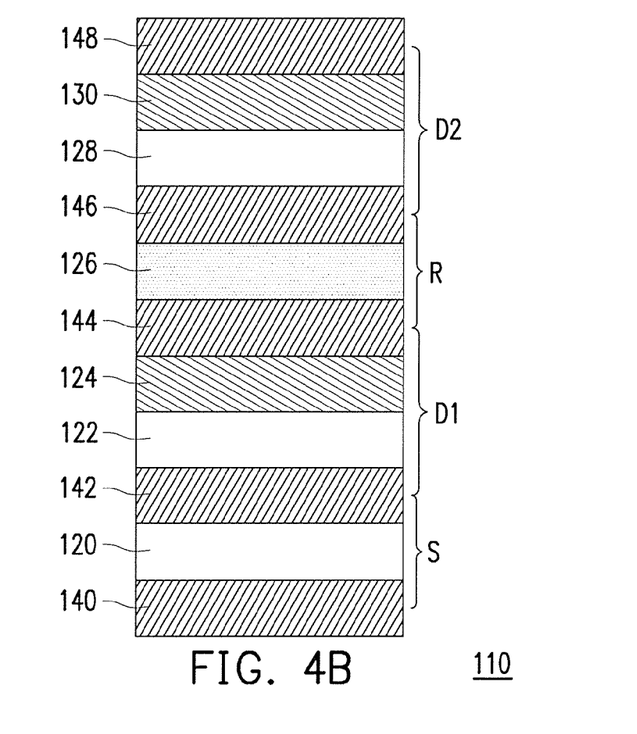
FIG. 4B is a schematic cross-sectional view of each structure of the memory cell of the resistive random access memory of the third embodiment of the invention.

FIG. 4A is a schematic connection view of each structure of a memory cell of a resistive random access memory of a third embodiment of the invention. FIG. 4B is a schematic cross-sectional view of each structure of the memory cell of the resistive random access memory of the third embodiment of the invention.

Referring to FIG. 4A and FIG. 4B, the memory cell 110 includes the selector structure S, the current limiter structure D1, a current limiter structure D2, and the resistor structure R, wherein the current limiter structure D1 is disposed between the selector structure S and the conductive lines WL/BL, the resistor structure R is disposed between the current limiter structure D1 and the conductive lines WL/BL, and the current limiter structure D2 is disposed between the resistor structure R and the conductive lines WL/BL. The layers of each structure and materials of each layer of the selector structure S, the current limiter structure D1, and the resistor structure R are the same as the first embodiment, it will not repeat them.

The current limiter structure D2 includes a conductive layer 148, a metal layer 130, a current limiting material layer 128, and the conductive layer 146 sequentially. Materials of the conductive layer 148 and the conductive layer 146 are conductive materials, for example, such as titanium nitride, tantalum nitride, titanium, tantalum, or indium tin oxide. A material of the metal layer 130 is metal, for example, such as titanium. A material of the current limiting material layer 128 is a semiconductor material, for example, such as silicon, or titanium dioxide.

In the memory cell 110 of the embodiment, the conductive layer 146 is used as an upper electrode of the resistor structure R and a lower electrode of the current limiter structure D2 simultaneously, the conductive layer 144 is used as an upper electrode of the current limiter structure D1 and a lower electrode of the resistor structure R simultaneously, and the conductive layer 142 is used as an upper electrode of the selector structure S and a lower electrode of the current limiter structure Dl simultaneously. The conductive layer 146, the conductive layer 144, and the conductive layer 142 may be single-layer materials or multi-layer materials respectively. When they are multi-layer materials, each layer can be used as an upper electrode or a lower electrode of each of the above-mentioned structures respectively, wherein materials of each layer may be the same or different.

In the memory cell 110 of the embodiment, the conductive layer 148 is used as an upper electrode of the memory cell 110, and the conductive layer 140 is used as a lower electrode of the memory cell 110. The conductive layer 148 used as an upper electrode may be in the same layer of the bit lines or the word lines, and the conductive layer 140 used as a lower electrode may be in the same layer of the bit lines or the word lines. For example, when the conductive layer 148 is in the same layer of the bit lines, the conductive layer 140 is in the same layer of the word lines; or when the conductive layer 148 is in the same layer of the word lines, the conductive layer 140 is in the same layer of the bit lines.

Figure 5A:
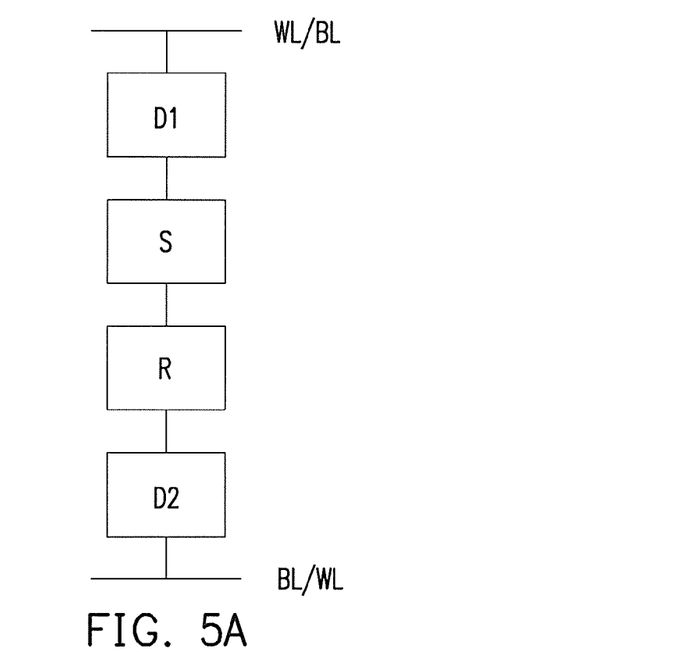
FIG. 5A is a schematic connection view of each structure of a memory cell of a resistive random access memory of a fourth embodiment of the invention.
Figure 5B:
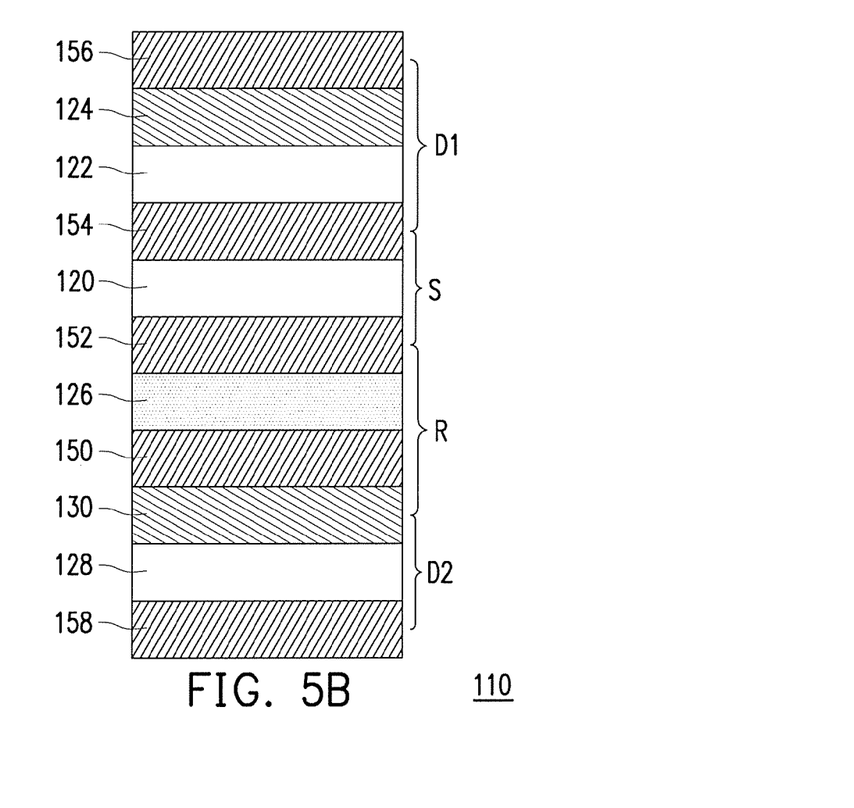
FIG. 5B is a schematic cross-sectional view of each structure of the memory cell of the resistive random access memory of the fourth embodiment of the invention.

FIG. 5A is a schematic connection view of each structure of a memory cell of a resistive random access memory of a fourth embodiment of the invention. FIG. 5B is a schematic cross-sectional view of each structure of the memory cell of the resistive random access memory of the fourth embodiment of the invention.

Referring to FIG. 5A and FIG. 5B, the memory cell 110 includes the selector structure S, the current limiter structure D1, the current limiter structure D2, and the resistor structure R, wherein the current limiter structure D1 is disposed between the selector structure S and the conductive lines WL/BL, the resistor structure R is disposed between the selector structure S and the conductive lines BL/WL, and the current limiter structure D2 is disposed between the resistor structure R and the conductive lines BL/WL. The layers of each structure and materials of each layer of the selector structure S, the current limiter structure D1, and the resistor structure R are the same as the second embodiment, it will not repeat them.

The current limiter structure D2 includes the conductive layer 150, the metal layer 130, the current limiting material layer 128, and a conductive layer 158 sequentially. Materials of the conductive layer 150 and the conductive layer 158 are conductive materials, for example, such as titanium nitride, tantalum nitride, titanium, tantalum, or indium tin oxide. The material of the metal layer 130 is metal, for example, such as titanium. The material of the current limiting material layer 128 is a semiconductor material, for example, such as silicon, or titanium dioxide. The purpose of the second current limiter D2 is to limit current in the direction opposite to the direction for which the first current limiter D1 is effective, since the Schottky barrier is effective primarily in one preferred direction.

In the memory cell 110 of the embodiment, the conductive layer 154 is used as an upper electrode of the selector structure S and a lower electrode of the current limiter structure D1 simultaneously, the conductive layer 152 is used as an upper electrode of the resistor structure R and a lower electrode of the selector structure S simultaneously, and the conductive layer 150 is used as an upper electrode of the current limiter structure D2 and a lower electrode of the resistor structure R simultaneously. The conductive layer 154, the conductive layer 152, and the conductive layer 150 may be single-layer materials or multi-layer materials respectively. When they are multi-layer materials, each layer can be used as an upper electrode or a lower electrode of each of the above-mentioned structures respectively, wherein materials of each layer may be the same or different.

In the memory cell 110 of the embodiment, the conductive layer 156 is used as an upper electrode of the memory cell 110, and the conductive layer 158 is used as a lower electrode of the memory cell 110. The conductive layer 156 used as an upper electrode may be in the same layer of the bit lines or the word lines, and the conductive layer 158 used as a lower electrode may be in the same layer of the bit lines or the word lines. For example, when the conductive layer 156 is in the same layer of the bit lines, the conductive layer 158 is in the same layer of the word lines; or when the conductive layer 156 is in the same layer of the word lines, the conductive layer 158 is in the same layer of the bit lines.

In summary, the resistive random access memory of the invention includes the selector structure, the first current limiter structure, and the resistor structure. By connecting the selector structure and the current limiter structure onto the resistor structure (i.e. 1R1D1S or 1D1S1R structure) to replace with the traditional resistive random access memory structure (one transistor connected to one resistor structure, i.e. 1T1R structure), the degree of integration of the device can be increased.

The resistive random access memory of the invention includes the selector structure. A Schottky barrier may be formed between the conductive layer and the selected material layer of the selector structure, which can be used as a switch for controlling the memory cell circuit. Or the selected layer is an amorphous chalcogenide with threshold voltage Vth. That is, the circuit is maintained open when the bias voltage V is not reached the Vth (i.e. 0<|V|<|Vth|), and the circuit is closed when the bias voltage V exceeds the Vth (i.e. |V|>|Vth|).

The resistive random access memory of the invention includes the first current limiter structure. A Schottky barrier is Ruined the current limiting material layer and the adjacent conductive layer, so that under a reverse-bias condition, the barrier is sufficiently wide to limit current. That is, the current flowing through the resistor structure can be controlled to less than a saturation current value, so that the irreversible damage resulting from the resistance changed during the SET operating process by the resistor structure can be avoided.

The resistive random access memory of the invention further includes the second current limiter structure disposed another side of the resistor structure near the first current limiter structure or the selector structure. The second current limiter structure can be used as a current limiter for controlling the current volume of the memory cell circuit when the memory cell is operated in another polarity. That is, the current flowing through the resistor structure can be controlled to less than a saturation current value, so that the irreversible damage resulting from the resistance changed during the SET operating process by the resistor structure can be avoided.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A resistive random access memory, comprising:
   a memory cell disposed at an intersection point between a first conductive line and a second conductive line, and the memory cell comprises three elements in series, wherein the three elements comprise:
   a selector structure, wherein the selector structure comprises a first conductive layer, a selected material layer, and a second conductive layer sequentially;
   a first current limiter structure, wherein the first current limiter structure comprises a third conductive layer, a first metal layer, a first current limiting material layer, and the first conductive layer sequentially, a material of the first current limiting material layer is titanium dioxide, a material of the third conductive layer is different from a material of the first metal layer, materials of the first conductive layer are titanium nitride, tantalum nitride, or indium tin oxide, and the material of the first metal layer is titanium; and
   a resistor structure,
   wherein the first current limiter structure is disposed between the selector structure and the resistor structure, or the selector structure is disposed between the resistor structure and the first current limiter structure.

2. The resistive random access memory according to claim 1, wherein the resistor structure comprises a fifth conductive layer, a variable resistor layer, and a sixth conductive layer sequentially.

3. The resistive random access memory according to claim 2, wherein one of the fifth or sixth conductive layers has a higher oxygen affinity than the other.

4. The resistive random access memory according to claim 2, wherein materials of the fifth conductive layer and the sixth conductive layer comprise titanium nitride, tantalum nitride, titanium, tantalum, or indium tin oxide.

5. The resistive random access memory according to claim 2, wherein a material of the variable resistor layer comprises transition metal oxide.

6. The resistive random access memory according to claim 2, wherein the material of the variable resistor layer comprises aluminum, titanium, tellurium, copper, silver, or nickel.

7. The resistive random access memory according to claim 1, wherein the memory cell further comprises a second current limiter structure disposed in series with the three elements.

8. The resistive random access memory according to claim 7, wherein the second current limiter structure comprises a seventh conductive layer, a second current limiting material layer, and an eighth conductive layer.

9. The resistive random access memory according to claim 8, wherein materials of the seventh conductive layer and the eighth conductive layer comprise titanium nitride, tantalum nitride, titanium, tantalum, or indium tin oxide.

10. The resistive random access memory according to claim 8, wherein a material of the second current limiting material layer comprises silicon or titanium dioxide.

11. The resistive random access memory according to claim 1, wherein materials of the second conductive layer comprise titanium nitride, tantalum nitride, titanium, tantalum, or indium tin oxide.

12. The resistive random access memory according to claim 1, wherein a material of the selected material layer comprises silicon or titanium dioxide or an amorphous chalcogenide.

13. The resistive random access memory according to claim 1, wherein the material of the third conductive layer comprises titanium nitride, tantalum nitride, tantalum, or indium tin oxide.

* * * * *